United States Patent
Meck et al.

(10) Patent No.: US 7,687,707 B2
(45) Date of Patent: Mar. 30, 2010

(54) VIA STRUCTURES IN SOLAR CELLS WITH BYPASS DIODE

(75) Inventors: Robert Meck, Placitas, NM (US); Paul R. Sharps, Albuquerque, NM (US)

(73) Assignee: Emcore Solar Power, Inc., Albuquerque, NM (US)

( * ) Notice: Subject to any disclaimer, the term of this patent is extended or adjusted under 35 U.S.C. 154(b) by 745 days.

(21) Appl. No.: 11/280,379

(22) Filed: Nov. 16, 2005

(65) Prior Publication Data

US 2007/0107772 A1    May 17, 2007

(51) Int. Cl.
*H01L 31/00* (2006.01)

(52) U.S. Cl. .................. 136/255; 136/256; 136/261; 136/262

(58) Field of Classification Search .................. 136/252
See application file for complete search history.

(56) References Cited

U.S. PATENT DOCUMENTS

| | | | |
|---|---|---|---|
| 6,278,054 B1* | 8/2001 | Ho et al. | 136/256 |
| 2003/0140962 A1* | 7/2003 | Sharps et al. | 136/249 |
| 2004/0089339 A1* | 5/2004 | Kukulka et al. | 136/251 |

OTHER PUBLICATIONS

"Substrate" and "substraturm" entries in the Webster's II New Riverside University Dictionary, Riverside Publishing Company 1988. p. 1156.*

* cited by examiner

*Primary Examiner*—Alex Noguerola

(57) ABSTRACT

A solar cell including a semiconductor body with a multi-junction solar cell and an integral bypass diode, and a pair of vias extending between the upper and lower surfaces, forming determined on the lower surface and electrically coupling the anode of the bypass diode with the conductive grid on the upper surface.

12 Claims, 5 Drawing Sheets

VIA STRUCTURES IN SOLAR CELLS WITH BYPASS DIODE

GOVERNMENT RIGHTS STATEMENT

The U.S. Government has certain rights pursuant to the provisions of DFAR 227-12 (January 1997) to practice or have practiced the subject invention for or on behalf of the United States throughout the world. Portions of the material in this specification arose as a result of U.S. Government support under a subcontract to a U.S. Government Agency. The U.S. Government has a paid-up license in this invention and the right in limited circumstances to require the patent owner to license others on resonable terms as provided for by the terms of the contract.

REFERENCE TO RELATED APPLICATIONS

This application is related to U.S. patent application Ser. No. 11/109,016 filed Apr. 19, 2005.

BACKGROUND OF THE INVENTION

1. Field of the Invention

The present invention relates to the field of solar cell semiconductor devices, and particularly to integrated semiconductor structures including a multijunction solar cell and an integral bypass diode.

2. Description of the Related Art

Photovoltaic cells, also called solar cells, are one of the most important new energy sources that have become available in the past several years. Considerable effort has gone into solar cell development. As a result, solar cells are currently being used in a number of commercial and consumer-oriented applications. While significant progress has been made in this area, the requirement for solar cells to meet the needs of more sophisticated applications has not kept pace with demand. Applications such as satellites used in data communications have dramatically increased the demand for solar cells with improved power and energy conversion characteristics.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as the payloads become more sophisticated, solar cells, which act as the power conversion devices for the on-board power systems, become increasingly more important.

Solar cells are often fabricated in vertical, multijunction structures, and in horizontal arrays, with the individual solar cells connected together in a series. The shape and structure of an array, as well as the number of cells it contains, are determined in part by the desired output voltage and current.

When solar cells in an array are all receiving sunlight, or are illuminated, each cell in the array will be forward biased and will be carrying current. However, if any of the cells are not illuminated, because of shadowing or damage, those shadowed cells are still in the array circuit and may be forced to become reversed biased in order to carry the current generated by the illuminated cells. This reverse biasing can degrade the cells and can ultimately render the cells inoperable. In order to prevent reverse biasing, a diode structure in parallel with the solar cells in a single multijunction cell is often implemented.

However, when the solar cell is not receiving sunlight, whether because of shading by a movement of the satellite, or as a result of damage to the cell, then resistance exists along the cell path. As solar cells exist in an array, current from illuminated cells must pass through shaded cells. If there were no diode, the current would force its way through the cell layers, reversing the bias of such cells and permanently degrading, if not destroying the electrical characteristics of such cells.

If the cell contains a diode, however, the current can be offered an alternative, parallel path, and the shaded cells will be preserved. The problem with this concept has been the difficulty in creating a diode that is relatively easy to manufacture and which uses a very low level of voltage to turn on and operate.

The purpose of the bypass diode is to draw the current away from the shadowed or damaged cell. The bypass diode becomes forward biased when the shadowed cell becomes reverse biased. Since the solar cell and the bypass diode are in parallel, rather than forcing current through the shadowed cell, the diode draws the current away from the shadowed cell and completes the electrical current to maintain the connection in the next cell.

If a cell is shaded or otherwise not receiving sunlight, in order for the current to choose the diode path, the turn on voltage for the diode path must be less than the breakdown voltage along the cell path. The breakdown voltage along the cell path will typically be at least five volts, if not more. In an implementation utilizing a Schottky bypass diode. The Schottky contact requires a relatively small amount of voltage to "turn on", about 600 millivolts. However, in a multijunction solar cell with a germanium substrate, to pass through the Ge junction the bias of the Ge junction must be reversed, requiring a large voltage. Reversing the bias of the Ge junction requires approximately 9.4 volts, so nearly ten volts are needed for the current to follow the diode path. Ten volts used to reverse the bias of the Ge junction is ten volts less than otherwise would be available for other applications.

Since a solar cell is fabricated as a vertical, multijunction structure, one electrical contact is usually placed on the top surface of the cell, and the other contact on the bottom of the cell, to avoid internal interconnections which may affect reliability and cost. A variety of designs are also known in which both contacts are placed on one side of the cell, and as represented in U.S. patent application Ser. No. 11/109,616 of the instant assignee. The presence of a bypass diode in an integrated solar cell presents another complication, since a connection must be made from both the multijunction solar cell and from the bypass diode on the top surface of a first cell to the bottom surface of the adjoining cell in the array.

Prior art interconnection arrangements for solar cell arrays have utilized an electrical contact to the top layer of the wafer to contact the anode of the bypass diode, and to the bottom surface of the adjoining cell. Although such an arrangement is generally satisfactory for most applications, there are certain applications in which present more stringent design requirement with both terminals of the solar cell and the bypass diode on the same side of the cell are required. Prior to the present invention, solar cell solar celldesigns have not been able to meet such design requirements.

SUMMARY OF THE INVENTION

1. Objects of the Invention

It is an object of the present invention to provide an improved solar cell array.

It is another object of the invention to provide a via in a solar cell with an integral bypass diode so that both anode and cathode terminals are on one side.

It is another object of the present invention to provide a multiple via configuration in a solar cell semiconductor device for both the surface grids and the anode of the bypass diode for improved reliability and higher manufacturing yields.

It is still another object of the invention to provide an improved method for manufacturing a solar cell array by utilizing multi-contact via interconnects between the upper surface and the backside of the wafer including a bypass diode.

Additional objects, advantages, and novel features of the present invention will become apparent to those skilled in the art from this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, with are within the scope of the invention as disclosed and claimed herein and with respect to which the invention could be of utility.

2. Features of the Invention

Briefly, and in general terms, the present invention provides a solar cell including a semiconductor body having an upper surface and an opposing lower surface; a multijunction solar cell disposed between said upper and lower surfaces; a bypass diode disposed on the semiconductor body and electrically connected across the multijunction solar cells for passing current when the solar cell is shaded; and an electrically conducting via making contact with a terminal of the bypass diode and extending from the upper surface to a contact on the lower surface of the semiconductor body.

The novel features which are considered as characteristic of the invention are set forth in particular in the appended claims. The invention itself, however, both as to its construction and its method of operation, together with additional objects and advantages thereof, bets will be understood from the following description of specific embodiments when read in connection with the accompanying drawings.

BRIEF DESCRIPTION OF THE DRAWINGS

These and other features and advantages of this invention will be better and more fully appreciated by reference to the following detailed description when considered in conjunction with the accompanying drawings, wherein.

DESCRIPTION OF THE PREFERRED EMBODIMENT

Figure 1B:
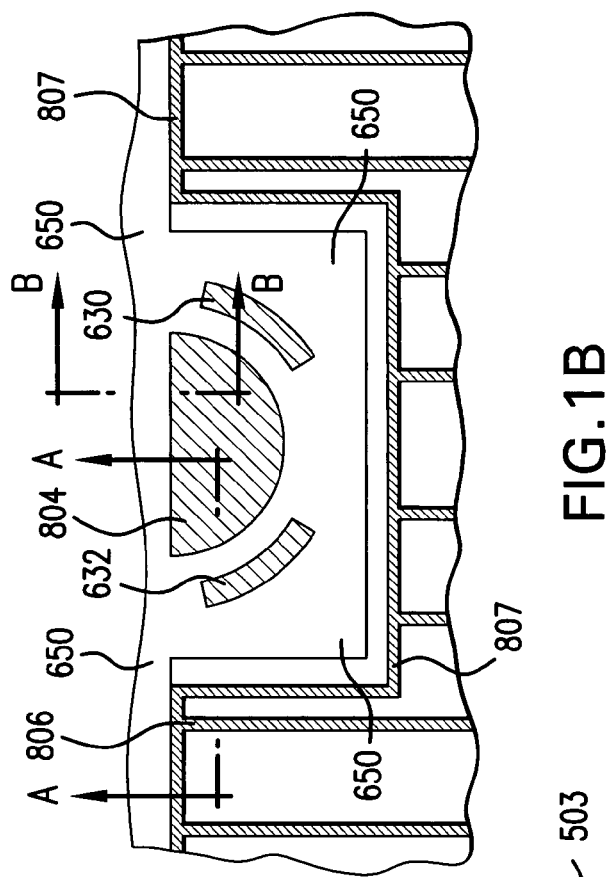
FIG. 1B is an enlarged top view of the solar cell of FIG. 1A showing the bypass diode.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The present invention relates to the interconnection of the anode and cathode contacts of the III-V multi-junction solar cells in an array by use of metallic clips or jumpers which are bonded or welded to the adjoining cells. Solar cell semiconductor devices, such as those depicted in U.S. Pat. No. 6,680,432, often include bypass diodes epitaxially grown on the substrate but separated from the solar cell structure by a trench that provides electrical isolation of the solar cell and the bypass diode. The surface of the trench is covered by a dielectric material of any suitable material that is nonconductive and reduces the possibility of an electrical chart or shunt path being created along the edge of the cell.

Figure 1A:
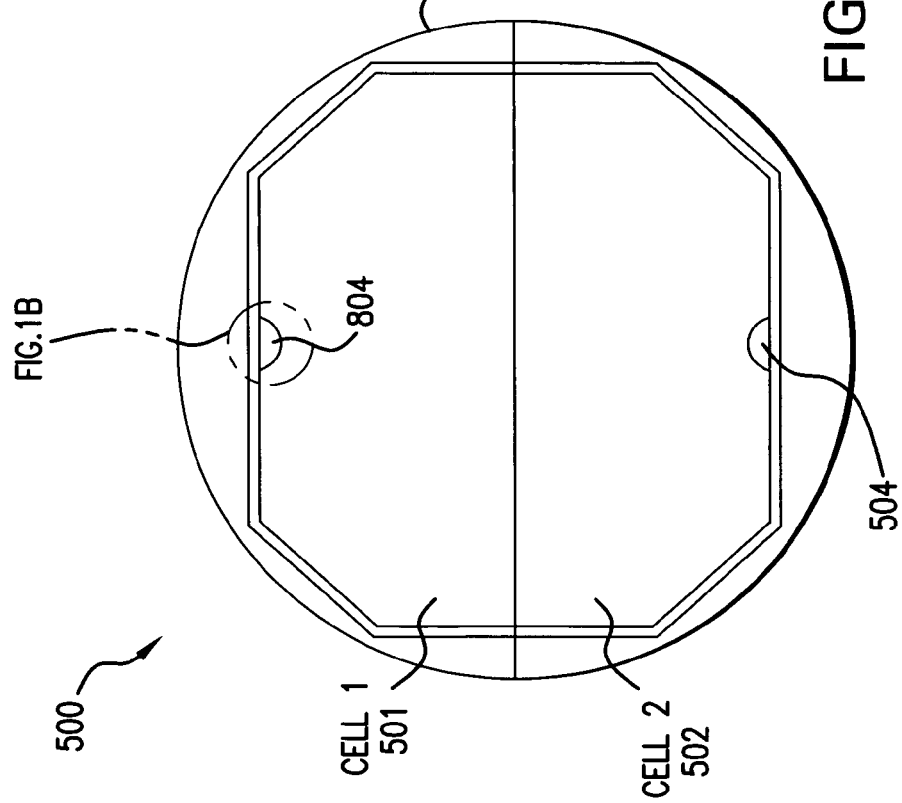
FIG. 1A is a top plan view of a semiconductor wafer with solar cell with a bypass diode.

FIG. 1A is a top plan view of a semiconductor wafer with solar cell with a bypass diode according to the present invention. A typical wafer 500 can accommodate two cells 501 and 502 which are scribed or cut out from the wafer 500 at the end of the fabrication process. The peripheral edge material 503 of the semiconductor wafer is discarded. Unlike configurations of the prior art, there are no electrical contacts on the top surface or cathode of the cells 501 or 502. The bypass diode 503 of cell 501, and the bypass diode 503 of cell 502 are also depicted, and are shown in greater detail in the enlarged portion of the wafer as shown in FIG. 1B.

FIG. 1B is an enlarged top plan view of the bypass diode 502 implemented in the solar cell of FIG. 1A. The Figure also shows some of the vertical conductors 806 which extend in parallel over the top surface of the cell 501 and function to make electrical contact with the top layer of the cell 501 and collect charge when the surface is illuminated. There is also depicted an electrically conducting bus 807 which extends around the periphery of the cell 501 and functions to electrically connect each of the conductors 806.

Figure 2:
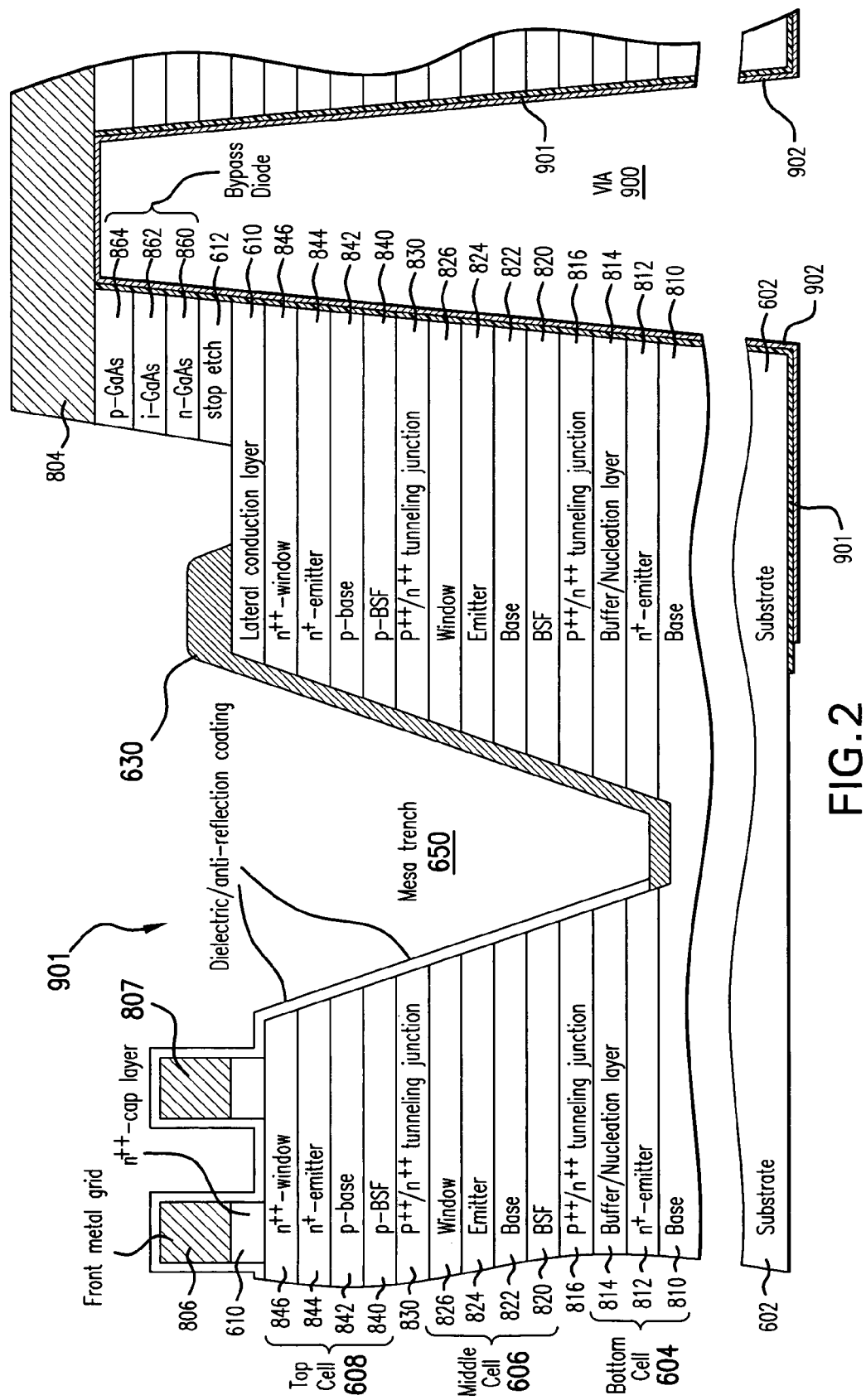
FIG. 2 is an enlarged cross-sectional view of the solar cell with a bypass diode through the A-A plane of FIG. 1B.
Figure 3:
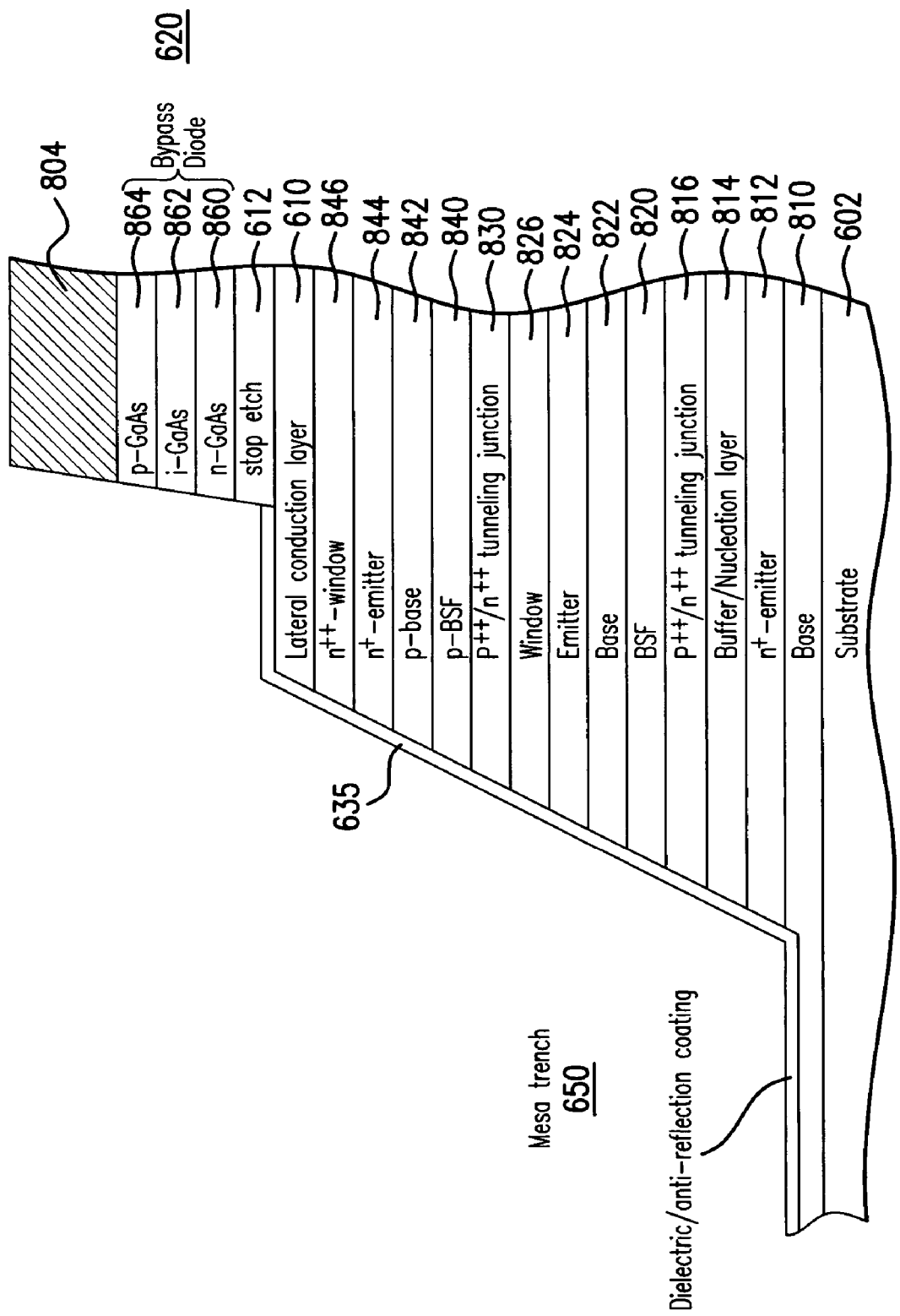
FIG. 3 is an enlarged top view of the solar cell with a bypass diode through the B-B plane of FIG. 1B.

The top plan view of the bypass diode 503 shows that it is semicircular in shape, and as will be seen in the cross-section views of FIGS. 2 and 3, is preferably implemented as a mesa structure fabricated over the top layer of the cell 501. Two spaced apart metal layers 630 and 632 extend over portions of the three sides of the mesa and function to make electrical contact between the top layer of the bypass diode 503 and the substrate located at the bottom of the trench 650. Another metal layer which functions as the electrical contact to the top terminal of the diode, which in the preferred embodiment is the anode of the diode.

FIG. 2 illustrates a detailed cross-sectional view of an integral semiconductor structure with a triple junction solar cell structure 640 and a bypass diode 503 through the A-A plane of FIG. 1B. The structure includes a substrate 602, a triple junction solar cell 640, a bypass diode 620, a trench or well 650, and an electrical shunt layer 630. The triple junction solar cell structure 640 further includes a bottom, middle and top subcells 604, 606, and 608 respectively. One of the conductive grid lines 806 is deposited over a lateral conduction layer 610. The contact pad 804 is also depicted as deposited over the bypass diode 620.

A layer of non-conduction or dielectric material causes the edges of the cell 501 to prevent the possibility of an electrical short or shunt path being created along the edge of the cell as will be seen in FIG. 3. In the preferred structure according to the present invention, the same material that is normally used as an antireflection coating (ARC) over the surface of the cell 501 is an ideal choice for this dielectric material. The ARC layer is normally applied to the top of the solar cell in current commercial devices, to reduce front surface reflection. The preferred embodiment uses a fabrication sequence of steps that allows the ARC layer to extend not only over the surface of the solar cell, but into the mesa trench to provide the protection of the vertical edge of the solar cell mesa.

In greater particularity, in one embodiment, the substrate is a p-type germanium ("Ge") substrate 602 which is entirely covered with a metallic layer on the backside of the semiconductor wafer 500 to form a lower metal contact pad 802 (as shown in FIG. 43). The bottom cell 604 contains a p-type Ge base layer 810, an n-type Ge emitter layer 812, and an n-type GaAs layer 814. The base layer 810 is deposited over the substrate 602. The layer 810 in one embodiment can be formed through diffusion of atoms into the Ge substrate from a deposited emitter layer 812. After the bottom cell 604 is fabricated, a sequence of p-type and n-type tunneling junction layers 815, are deposited to form a structure sometimes referred to as a tunneling diode that provides a circuit element to connect the bottom cell 604 with the next subcell 606.

The middle cell 606 further includes a back surface field ("BSF") layer 820, a p-type GaAs base layer 822, and n-type GaAs emitter layer 824, and an n-type gallium indium phosphide$_2$ (GaInP$_2$) window layer 826. The base layer 822 is deposited over the BSF layer 820 once the BSF layer 820 is deposited over the tunneling junction layers 816. The window layer 826 is subsequently deposited on the emitter layer 824 after the emitter layer 824 is deposited on the base layer 822. The BSF layer 820 is used to reduce the recombination loss in the middle cell 606. The BSF layer 820 drives minority carriers from a highly doped region near the back surface to minimize the effect of recombination loss. In other words, a BSF layer 820 reduces recombination loss at the backside of the solar cell and thereby reduces the recombination at the emitter region.

The window layer 826 used in the middle cell 606 also operates to reduce the recombination loss. The window layer 826 also improves the passivation of the cell surface of the underlying junctions. It should be apparent to one skilled in the art, that additional layer(s) may be added or deleted in the cell structure without departing from the scope of the present invention. Before depositing the layers of the top cell 608, p-type and n-type tunneling junction layers 830 are deposited over the middle cell 606 to form a tunnel diode connecting the middle cell 606 to the top cell 608.

The top cell 608, according to this embodiment, includes layer sequence of a p-type indium gallium aluminum phosphide$_2$ ("InGaAlP") BSF layer 840, a p-type GaInAP$_2$ base layer 842, and n-type$_2$ emitter layer 844, and an n-type aluminum indium phosphide$_2$ ("AlInP$_2$") window layer 846. The base layer 842 of the top cell 608 is deposited on the BSF layer 840 once the BSF layer 840 is deposited over the tunneling junction layers 730. The window layer 846 is subsequently deposited on the emitter layer 844 after the layer 844 is deposited on the base layer 842.

According to this embodiment, an n-type GaAs window or cap layer 846 is employed for enhancing better contact with metal materials. The cap layer 846 is deposited over the top cell 608. The lateral conduction layer 610, formed of n-type GaAs, is deposited over the cap layer 846. An n-type GaInP$_2$ stop etch layer is deposited over the lateral conduction layer 610. After the stop etch layer is deposited, the layers that will form the bypass diode on one portion of the cell 501 are epitaxially deposited over the entire wafer.

The bypass diode layers include in one embodiment, a sequence of an n-type GaAs layer 860, an i-type GaAs layer 862, and a p-type GaAs layer 864. The n-type layer 860 is deposited over the stop etch layer 612. The i-type layer 862 is deposited over the n-type layer 860. The p-type layer 864 is deposited over the i-type layer 862. After layer 864 is deposited, a contact pad 804 is deposited over the bypass diode 620. Once the anode contact pad 804 is formed, the polarity is formed, the result is that an integral p-i-n bypass diode with p-on-n polarity is formed over the solar cell. In another embodiment, an n-i-p bypass diode with n-on-p polarity can be formed over solar cell structure using similar process described above. It should be apparent to one skilled in the art that additional layer(s) may be added or deleted in the bypass diode 620 without departing from the scope of the present invention.

In one embodiment, a metal shunt layer 630 is deposited into a portion of the well 650. One end of the shunt 630 makes electrical contact with the substrate 602 and the other end of the shunt 630 makes electrical contact with the lateral conduction layer 610, and thereby to an active layer of the triple junction cell 644. An anti-reflection (AR) coating 808 may be deposited over certain parts of the solar cell to enhance solar cell performance.

A via 900 is etched from the bottom surface of the substrate though to the top surface of the wafer making a small circular opening on the top surface of the wafer. A dielectric layer is deposited over the interior surface of the via to insulate the layers, and a metal layer deposited over the dielectric layer to form an electrical path 902 between the top and bottom surfaces of the wafer. In particular, the path 902 makes electrical contact with the contact layer 804 of the bypass diode and forms a contact surface on the bottom of the wafer.

Figure 4A:
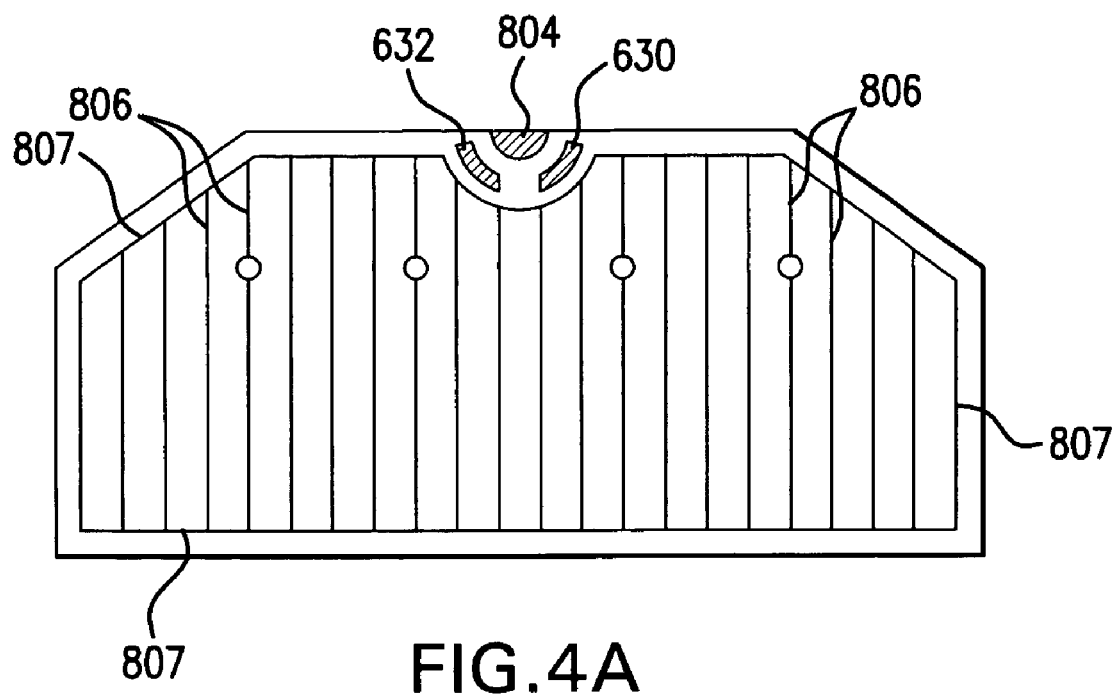
FIG. 4A is a top plan view of the solar cell with a bypass diode as cut from the wafer depicted in FIG. 1A.
Figure 4B:
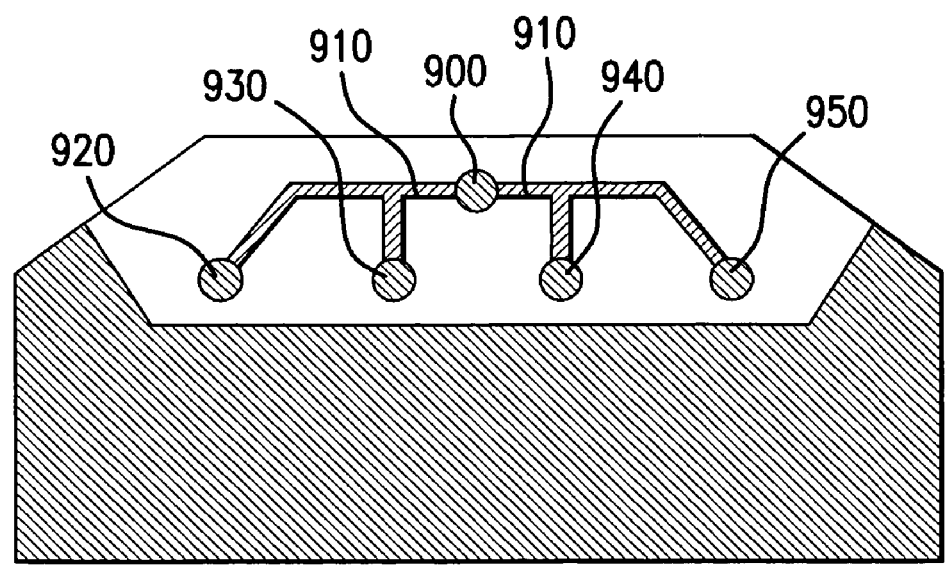
FIG. 4B is a bottom plan view of the solar cell with a bypass diode shown in FIG. 4A.

In addition to via 900, vias 920, 930, 940 and 950 are etched from the bottom surface of the substrate to make electrical contact with four of the grid lines 806 on the top surface of the wafer, at contact points respectively, as shown in FIGS. 4A and 4B. Connections 910 extend between the vias 900, 920, 930, 940, 950.

It should be noted that the multijunction solar cell structure could be formed by any suitable combination of group III to V elements listed in the periodic table, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorous (P), arsenic (As), antimony (Sb), and bismuth (Bi).

Figure 5:
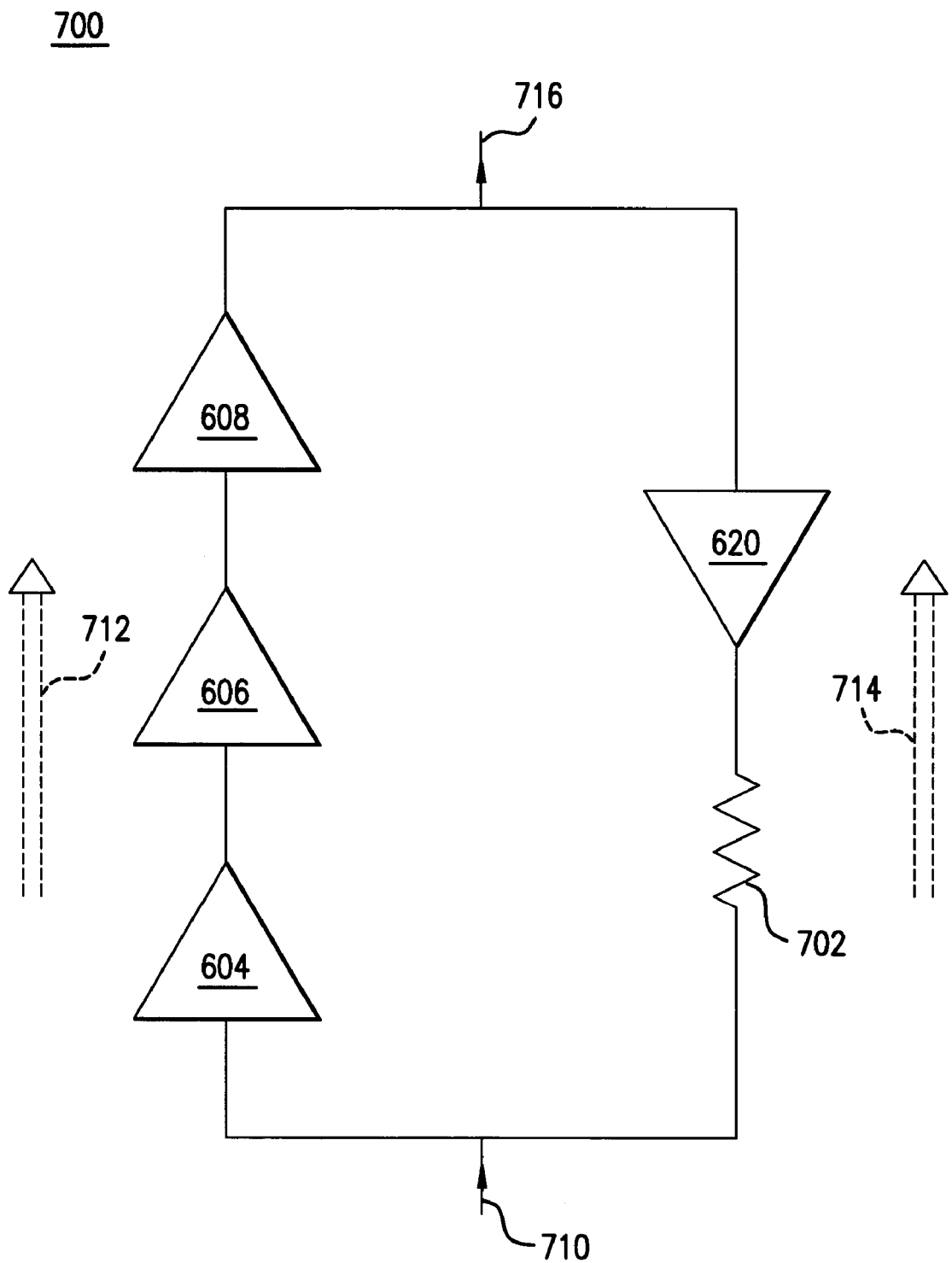
FIG. 5 is a circuit diagram of the solar cell with a bypass diode of FIG. 4A.

FIG. 5 is a circuit diagram 700 illustrating a triple junction solar cell structure and a bypass diode 620. The device 700 includes a top cell 608, a middle cell 606, a bottom cell 604, a bypass diode 620, a resistance block 702, and four paths 710-716. In one embodiment, the resistance block 702 includes resistance from the shortened portion of the multijunction solar cell structure that is situated underneath of the bypass diode 620 and the resistance from the shunt 630 shown in FIG. 2.

During normal operation (e.g., when solar cells 604-608 are exposed to sunlight, solar light, light, radiation, and/or photons), the solar cells 604-608 are forward biased. They convert solar energy to electrical energy and the generated electric current between the neighboring solar cells connected in series. It should be noted that the terms sunlight, solar light, light, radiation, and/or photons may be used interchangeably herein. In this embodiment, solar cells are organized in a series. While solar cells 604-608 are in forward biased, bypass diode 620 is reverse biased because bypass diode 620 has an opposite polarity from solar cells. Thus, when bypass diode 620 is in reverse bias mode, no electric current passes through the bypass diode 620.

Then electrical current generated from the neighboring solar cells arrives at solar cells 604-608 via path 710, solar cells 604-608 pass total electrical current, which includes the current converted by solar cells 604-608 and the current arriving from neighboring solar cells through path 710, to path 716 via path 712. Path 716 may be connected to another solar cell (such as solar cell 521 depicted in FIG. 6) and/or other electrical devices.

However, during the situation in which the solar cells 601-608 are in reverse bias mode when, for example, solar cells 604-608 are shadowed, the bypass diode 620 becomes forward biased. In this situation, bypass diode 620 become active and passes the current from neighboring solar cells via path 710 to path 716 through path 714. In other words, when the solar cells 604-608 are in reverse bias mode, the bypass diode 620 becomes forward biased and uses path 714 to pass the current from path 710 to path 716. Thus, in this circuit configuration, bypass diode protects the cells 604-608.

We claim:

1. A solar cell comprising:
a semiconductor body having an upper surface and an opposing lower surface, the semiconductor body including a substrate, a multijunction solar cell disposed between said upper and lower surfaces, and a bypass diode electrically connected across said multijunction solar cell for passing current when said solar cell is shaded; and
an electrically conducting via extending through the semiconductor body and a set of p-type and n-type layers of the bypass diode and making contact with a terminal of said bypass diode and extending from said upper surface to a contact on said lower surface;
wherein the semiconductor body comprises a sequence of layers of semiconductor material including a first region in which the sequence of layers of semiconductor material forms a sequence of subcells of said multijunction solar cell, and a second region separated from said first region by a trough in said sequence of layers and in which the sequence of layers forms a support for said bypass diode.

2. A solar cell as defined in claim 1, further comprising a passivation layer extending into said trough and disposed over edges of each layer of said sequence of layers in said first region.

3. A solar cell as defined in claim 1, wherein the sequence of layers of semiconductor material are epitaxially grown in substantially different process steps.

4. A solar cell as defined in claim 1, wherein the substrate includes Ge, and at least one of the subcells includes GaAs.

5. A solar cell as defined in claim 1, wherein the via comprises a dielectric layer making direct contact with said semiconductor body around an entire surface of the via, and a metallic conducting layer disposed over the dielectric layer for forming an electrical connection between the terminal of the bypass diode and said lower surface.

6. A solar cell as defined in claim 1, wherein said lower surface includes a first terminal making electrical contact with the lower surface of the semiconductor body, and a second terminal making electrical contact with at least one additional conducting via that extends from said upper surface to said lower surface.

7. A solar cell as defined in claim 6, wherein at least one of said vias makes electrical contact with an anode of said bypass diode at the upper surface, and at least one of said vias makes electrical contact with a conductive grid line extending over the upper surface.

8. A solar cell as defined in claim 7, wherein said contact on said lower surface electrically connects the at least one via making contact with the anode of said bypass diode on the upper surface and the at least one via making contact with the conductive grid line on the upper surface.

9. A solar cell as defined in claim 1, wherein the electrically conducting via extends entirely through the semiconductor body.

10. A solar cell semiconductor structure comprising:
a normally illuminated upper surface including a charge collecting element extending over a portion of said upper surface;
a lower surface, including a first terminal connected to said lower surface and a second terminal electrically isolated from said lower surface and connected to said charge collecting element on said upper surface;
a bypass diode connected across said solar cell and functioning to pass current when the solar cell is shaded; and
an electrically conducting via extending through said semiconductor structure and also through a set of p-type and n-type layers of the bypass diode and making contact with an outside terminal of the bypass diode and the charge collecting element on said upper surface;
wherein the semiconductor structure comprises a sequence of layers of semiconductor material including:
a first region in which the sequence of layers of semiconductor material forms a sequence of subcells of said multijunction solar cell; and
a second region separated from said first region by a trough in said sequence of layers and in which the sequence of layers forms a support for said bypass diode.

11. A solar cell as defined in claim 10, wherein the electrically conducting via extends from the charge collecting element on said upper surface to said second terminal on said lower surface.

12. A solar cell as defined in claim 10, wherein the semiconductor structure includes a Ge substrate, and the sequence of subcells includes GaAs.

* * * * *

UNITED STATES PATENT AND TRADEMARK OFFICE
CERTIFICATE OF CORRECTION

PATENT NO. : 7,687,707 B2  Page 1 of 1
APPLICATION NO. : 11/280379
DATED : March 30, 2010
INVENTOR(S) : Robert Meck and Paul R. Sharps It is certified that error appears in the above-identified patent and that said Letters Patent is hereby corrected as shown below:

On the Title Pg. Item (57) In the Abstract, cancel the text beginning on line 2 with "and a pair of" and ending at line 6 with "upper surface." and insert the following: --and an electrically conducting via making contact with a terminal of the bypass diode and extending from the upper surface to a contact on the lower surface of the semiconductor body.--.
Column 1, line 14, change "resonable" to --reasonable--.
Column 2, line 57, delete "present"; line 60, delete "solar celldesigns" and insert --designs--.
Column 3, line 22, change "with" to --which--; line 41, delete "bets".
Column 4, line 2, delete ";" and insert --.--; line 18, change "multi-junction" to --multijunction--; line 27, change "chart" to --short--; line 37, delete the first and second occurrences of "503"; line 41, delete "502".
Column 5, line 21, change "43" to --4B--.
Column 6, line 33, change "though" to --through--; line 53, change "phosphorous" to --phosphorus--.
Column 7, line 16, delete "(such as solar cell 521 depicted in FIG. 6)"; line 18, delete "601" and insert --604--; line 21, change "become" to --becomes--.

Signed and Sealed this

Eighteenth Day of May, 2010

David J. Kappos
*Director of the United States Patent and Trademark Office*